US011838012B2

(12) United States Patent
Leonardo (10) Patent No.: US 11,838,012 B2
(45) Date of Patent: Dec. 5, 2023

(54) POWER ON RESET CIRCUIT AND INTEGRATED CIRCUIT INCLUDING THE SAME

(71) Applicant: ams International AG, Jona (CH)

(72) Inventor: Vincenzo Leonardo, Wädenswil (CH)

(73) Assignee: AMS INTERNATIONAL AG, Jona (CH)

( * ) Notice: Subject to any disclaimer, the term of this patent is extended or adjusted under 35 U.S.C. 154(b) by 0 days.

(21) Appl. No.: 17/921,432

(22) PCT Filed: Apr. 19, 2021

(86) PCT No.: PCT/EP2021/060087
§ 371 (c)(1),
(2) Date: Oct. 26, 2022

(87) PCT Pub. No.: WO2021/219419
PCT Pub. Date: Nov. 4, 2021

(65) Prior Publication Data
US 2023/0088630 A1 Mar. 23, 2023

(30) Foreign Application Priority Data

Apr. 29, 2020 (EP) .................................... 20172116

(51) Int. Cl.
*H03K 17/22* (2006.01)
*H03K 17/14* (2006.01)
(Continued)

(52) U.S. Cl.
CPC ............ *H03K 17/145* (2013.01); *G05F 1/56* (2013.01); *G05F 3/30* (2013.01); *H03K 17/22* (2013.01)

(58) Field of Classification Search
None
See application file for complete search history.

(56) References Cited

U.S. PATENT DOCUMENTS 7,821,307 B2  10/2010  Chellappa
7,847,606 B2 * 12/2010  Hehemann ........... H03K 17/223
                                                    327/143

FOREIGN PATENT DOCUMENTS

JP       2012253597 A    12/2012

OTHER PUBLICATIONS

Meulemans, Bart (EP Authorized Officer), International Search Report and Written Opinion in corresponding International Application No. PCT/EP2021/060087 dated Jul. 14, 2021, 10 pages.

* cited by examiner

*Primary Examiner* — Jeffery S Zweizig
(74) *Attorney, Agent, or Firm* — MH2 TECHNOLOGY LAW GROUP LLP (57) ABSTRACT

A power on reset circuit comprises terminals for reference and supply potentials and a voltage divider coupled therebetween. First and second transistors of a bandgap circuit are resistively coupled to the reference potential terminal and have bases connected to the voltage divider. Current mirrors couple the collectors of the first and second transistors to an output terminal providing an output signal indicating a power on reset condition. A first compensation transistor is coupled between the collector of one of the transistors and the reference potential terminal, and a second compensation transistor is coupled between the output terminal and the reference potential terminal to compensate the (Continued)

effect of parasitic substrate currents in response to an external interference.

15 Claims, 3 Drawing Sheets

(51) Int. Cl.
*G05F 1/56* (2006.01)
*G05F 3/30* (2006.01)

POWER ON RESET CIRCUIT AND INTEGRATED CIRCUIT INCLUDING THE SAME

CROSS-REFERENCE TO RELATED APPLICATIONS

This patent application is the national stage entry of International Patent Application No. PCT/EP2021/060087, filed on Apr. 19, 2021, and published as WO 2021/219419 A1 on Nov. 4, 2021, and claims priority to European patent application 20172116.4 filed on Apr. 29, 2020, the disclosures of all of which are hereby incorporated by reference in their entireties.

TECHNICAL FIELD

The present disclosure relates to a power on reset circuit. Specifically, the present disclosure relates to a power on reset circuit that includes first and second transistors forming a bandgap circuit and current mirrors to couple the collectors of the transistors to an output terminal. The present disclosure also relates to an integrated circuit that includes a power on reset circuit to control portions of the integrated circuit.

BACKGROUND

Power on reset (POR) circuits are widely used in electronic devices to monitor the current level of the power supply voltage, keep the functional units of the electronic device in a reset condition when the power supply voltage is below a threshold level and release the reset when the power supply voltage exceeds the threshold level. A conventional POR circuit includes a bandgap arrangement that determines a tripping point based on the bandgap voltage of silicon which can be reliably reproduced with a corresponding arrangement of bipolar transistors. The POR circuit is always active maintaining the power on condition as long as the supply voltage level is above the threshold. The POR circuit may be included in an integrated circuit that is subjected to external interferences such as high temperature or electromagnetic fields when the circuit is used in an industrial or automotive environment or subjected to stray light impinging on the POR circuit when the integrated circuit is used as an optoelectronic device. Such interferences may cause parasitic substrate currents in the semiconductor substrate that incorporates the POR circuit and the integrated circuit. The parasitic substrate currents may flow vertically and/or laterally acting upon the collectors of the bipolar transistors of the POR circuit. The substrate currents may be caused as leakage currents or photo currents between the collectors of the bipolar transistors of the POR circuit and the semiconductor substrate or through parasitic transistors established within the substrate including the collectors of the bipolar transistors of the POR circuit.

The switching operation of a bandgap current switch in a POR circuit is based on a ratio of substantially different currents through the bipolar transistors of the bandgap circuit that form a current switch. The currents are mirrored into the output terminal to pull the output terminal to the high side or the low side voltage supply terminals. When parasitic substrate currents are generated by external interferences, corresponding currents are caused at the bipolar transistors of the bandgap current switch so that the mirror ratios of the current mirrors generate unsymmetric parasitic contributions to the pull-up and the pull-down currents at the output terminal. As a result, the POR circuit may get a tendency to indicate a power on reset situation in response to an external interference event, although the supply voltage level still has a sufficient and acceptable voltage level. The circuit will interrupt and reset its operation and data may be lost so that there is a desire to avoid such a fail reset switching of the POR circuit.

There is a need for a POR circuit that is able to work in an environment that generates external interferences. There is a need for a POR circuit that operates more robustly in industrial, automotive and photoelectronic applications, and there is a need for a POR circuit that is less sensitive to external interferences such as high temperature, electromagnetic interference (EMI), and photonic light. The POR circuit should avoid a fail reset in response to an external interference such as high temperature, EMI or optical stray light that may generate parasitic currents such as leakage currents, lateral currents or photoelectric currents.

It is an object of the present disclosure to provide a power on reset circuit that operates more robustly in an environment with external interferences.

It is another object of the present disclosure to provide a power on reset circuit that provides a stable trip point, even under external interferences.

It is yet another object of the present disclosure to provide a POR circuit that operates accurately without reset failures under rough environmental conditions.

It is yet another object of the present disclosure to provide an optoelectronic integrated circuit or an integrated circuit using ESD protected external terminals that operates more accurately.

SUMMARY

According to the present disclosure, one or more of the above-mentioned objects are achieved by a power on reset circuit comprising the features of present claim 1.

According to an embodiment, a power on reset circuit comprises reference potential and supply potential terminals which may be operatively coupled to a supply voltage source. A voltage divider connected between the reference and supply potential terminals senses the level of the supply voltage. First and second transistors have a base that is connected to an output node of the voltage divider and have an emitter which is coupled through a resistive network to the reference potential terminal. A first current mirror is coupled to the collector of the first transistor and to an output terminal, wherein the output terminal is configured to provide an output signal in response to a voltage between the reference and supply potential terminals. A second current mirror is connected to the collector of the second transistor and further coupled to the output terminal through a third current mirror. The power on reset circuit further comprises first and second compensation transistors, wherein the first compensation transistor is coupled between the collector of one of the first and second transistors and the reference potential terminal and the second compensation transistor is coupled between the output terminal and the reference potential terminal.

The first and second compensation transistor devices compensate parasitic currents in the semiconductor substrate that incorporates the power on reset circuit. For example, the parasitic substrate currents may be leakage currents through the collector substrate diodes of the bipolar transistors caused by an external interference such as high temperature. The parasitic substrate currents may be photoelectric currents through the collector substrate diodes of the bipolar transistors which may act as a parasitic photodiode when stray light couples into the backside of the integrated circuit which can be the case when the power on reset circuit is included in an optoelectronic device. The parasitic currents may be lateral currents trough parasitic transistors parasitically formed by the collectors of the bipolar transistors, the semiconductor substrate and another doping region when the other doping region is biased by an electromagnetic event. This may be the case when the doping region is connected to an external terminal such as a pad area in a circuit used in an electromagnetic environment. Such circuits are often equipped with electrostatic discharge (ESD) structures including such a doping region to guide an EMI impulse into the substrate and prevent it from entering into the circuit. In this case, the doping region of the ESD structure may be negatively biased. The first and second compensation transistors compensate such a parasitic current in that they generate an additional current from the collector of one of the bipolar transistors of the bandgap circuit into the substrate and another additional current from the output terminal into the substrate. The substrate may be connected to reference potential. In another embodiment, the substrate may be connected to another potential different from reference potential. The other potential may be lower than reference potential. The effects of the first compensation transistor on the bandgap current switch formed by the first and second transistors and of the second compensation transistor on the output terminal translate through the current mirrors such that parasitic unsymmetric effects caused by an external interference are substantially compensated.

The first and second compensation transistors make the circuit more robust against external interferences in that the tripping point of the POR circuit is stabilized. The first and second compensation transistors generate symmetric parasitic pull-up and pull-down current contributions at the output terminal of the POR circuit so that the tripping point remains stable, thereby avoiding a fail reset.

The first and second compensation transistors may be matched to the bipolar transistors that form the bandgap current switch. The first and second compensation transistors may each be formed of a bipolar transistor having base, collector and emitter regions, wherein the base is connected to the collector or the emitter. The base and emitter regions of the first and second compensation transistors are connected with each other so that a substrate diode is formed from the collector region of said compensation transistors to the semiconductor substrate. The semiconductor substrate may be of P-conductivity or P-doped and the transistors are NPN-transistors having N-doped collector and emitter regions and P-doped base regions. The first and second compensation transistors use the same building blocks used to form the first and second bipolar transistors of the bandgap current switch so that it can be assumed that the bandgap transistors and the compensation transistors have matching structures, matching dimensions and thus matching electrical behaviour.

The first and second transistors of the current switch form a bandgap circuit that exhibits a switch point at the bases of the transistors at substantially 1.2 V. The bandgap function is achieved in that the collector area of one of the transistors such as the first transistor is a multiple of the collector area of the second transistor. For example, the collector area of the first transistor may be an integer multiple of the collector area of the second transistor such as 4:1. Other integer multiples or other relations are also possible. Usually an integer multiple is achieved in that bipolar transistor units are connected in parallel to each other. In one example, four units may be connected together to achieve a collector area of four units for the first transistor, and one collector unit may be used for the second transistor to achieve the 4:1 collector area ratio.

The first compensation transistor may be connected to the one of the transistors of the bandgap current switch that has the smaller collector area such as the area of one unit of the second transistor, wherein the base and the emitter of the first compensation transistor are connected to each other and to the reference potential terminal.

The collector of the first bipolar transistor of the bandgap current switch is coupled to the output terminal through a first current mirror. The first current mirror comprises an input path which includes a diode-connected transistor coupled between the collector of the first transistor and the supply potential terminal. The first current mirror further comprises an output path which includes another transistor, wherein the control terminals of the transistors of the input and the output paths of the first current mirror are connected to each other so that the potential from the diode-connected transistor of the input path controls the current through the transistor of the output path. The transistor of the output path is connected between the output terminal and the supply potential terminal. The first current mirror has a defined current transformation ratio between the current through the input path and the current through the output path such that the output signal at the output terminal provides a reliable tripping point under normal operating conditions. In an embodiment, the current transformation ratio of the first current mirror may be M1:1. M1 may be an integer value. In an embodiment, the current transformation ratio of the first current mirror may be 6:1. The current transformation ratio is achieved with corresponding ratios of width to length (W/L) of the transistors of the input path relative to the output path, wherein these transistors are field-effect transistors.

In a corresponding way, the second current mirror comprises an input path including a diode-connected transistor connected to the collector of the second transistor of the bandgap current switch and the supply potential terminal. An output path includes another transistor, wherein the control terminals of the transistors of the input and output paths of the second current mirror are connected with each other. The output path of the second current mirror is coupled to the output terminal through a third current mirror which comprises an input path including a diode-connected transistor connected between the output path transistor of the second current mirror and the reference potential terminal and an output path including another transistor connected between the output terminal and the reference potential terminal. The control terminals of the transistors of the input and output paths of the third current mirror are connected with each other.

The second current mirror and the third current mirror each have an individual current transformation ratio forming a joint current transformation ratio of the second and third current mirrors. The current transformation ratios may be integer numbers, although rational numbers are also possible. For example, the current mirror ratio of the second current mirror may be M2:1 and the current transformation ratio of the third current mirror may be M3:1. In an embodiment, M2:1 may be 3:1 and M3:1 may be 1:1, resulting in a joint transformation ratio of 3:1. Other ratios may also be useful.

The second compensation transistor connected between the output terminal and the reference potential terminal is connected in parallel to the output path transistor of the third current mirror. In an embodiment, the base-collector path of the second compensation transistor is connected in parallel to the output path transistor of the third current mirror.

The matching elements in the POR circuit, such as the bipolar transistors and the transistors of the current mirrors that may be field effect transistors having a defined width/length (W/L) ratio to establish a current transformation ratio of the corresponding current mirror, are set such that parasitic substrate currents either vertically or laterally within the substrate generated by external events such as high temperature, EMI, stray light generate a substantially equalized contribution to the parasitic pull-up and the pull-down currents at the output terminal. The collector areas of the first and second transistors are N1 and N2, respectively, the collector areas of the first and second compensation transistors are N3 and N4, respectively, and the current mirror transformation ratios of the first, second and third current mirrors are M1:1, M2:1 and M3:1, respectively. For an equalized contribution of parasitic currents at the output terminal, these collector areas and current transformation ratios should meet the following formula:

$$N1/M1=(N2+N3)/(M2\times M3)+N4$$

In an embodiment, the collector areas of the first and second transistors relate as 4:1, the current transformation ratio of the first current mirror is 3:1, the current transformation ratio of the second current mirror is 6:1 and the current transformation ratio of the third current mirror is 1:1 and the ratios of collector areas between the second transistor of the bandgap current switch and the first and second compensation transistors is 1:1, so that the above mentioned formula is met as follows:

$$4/3=(1+1)/(6\times 1)+1$$

In an embodiment, the transistors of the bandgap current switch may be bipolar transistors so that the tripping point of the current switch is the bandgap voltage supplied to the transistor bases, about 1.2 V. The first and second compensation transistors are also realized by bipolar transistors to achieve sufficient matching with the bipolar transistors of the bandgap current switch. The transistors of the current mirrors are made of field effect transistors including P-channel MOS transistors for current mirrors connected to the supply potential terminal and N-channel MOS transistors for the current mirror connected to the reference potential terminal. The width/length (W/L) ratio of the field effect transistors are reproducible and match each other so that the current transformation ratio can be set reliably with field effect transistors. Overall, the combination of bipolar and field effect transistors including compensation transistors at one of the transistors of the bandgap current switch and at the output terminal achieve a POR circuit which has a defined and robust tripping point even in case of external interferences. While the tripping point of the bandgap current switch is defined by the bandgap reference voltage of a silicon diode such as the base emitter diode of a bipolar NPN-transistor, the switching threshold concerning the supply voltage level between the supply and reference potential terminals can be set by the voltage divider connected between the supply voltage terminals. The voltage divider has an intermediate node or output node connected to the bases of the first and second transistors of the bandgap current switch. The voltage divider may be a resistive voltage divider, particularly an ohmic voltage divider having ohmic resistors.

Another voltage divider may be provided between the emitters of the bipolar transistors of the bandgap current switch and the reference potential terminal. The outer terminals of that voltage divider may be connected between the emitter of the first bipolar transistor and the reference potential terminal and the emitter of the second bipolar transistor may be connected to an intermediate node between the resistors of said voltage divider. This voltage divider may be a resistive voltage divider, particularly an ohmic voltage divider having ohmic resistors.

The POR circuit may be incorporated in a semiconductor substrate of a first conductivity type such as a P-substrate. The substrate includes a deep well doping of another conductivity type such as an N-well which forms the collector of one of the bandgap current switch transistors. Another doping region of the second conductivity type such as an N-well may be disposed in the semiconductor substrate. In the case of a negatively biased N-well, a lateral substrate current from the N-well collector region through the P-substrate to the N-well doping region forming a parasitic lateral transistor may be generated. This may be the case, for example, when the N-well doping region is connected to an external terminal that can receive an EMI impulse. According to the principles of the present disclosure, the effect of the substrate current is compensated by the first and second compensation transistors, as explained above, so that additional lateral substrate currents are generated that compensate the EMI event in that they equalize the pull-up and pull-down current contributions at the output terminal. The first and second compensation transistors generate such currents only in an external interference situation so that their power consumption is very low and almost negligible. Substantially no power is consumed by the first and second compensation transistors in normal operating mode.

An optoelectronic integrated circuit that resolves one or more of the above-mentioned objects comprises the features of present claim 14.

The optoelectronic integrated circuit comprises a circuit portion that includes one or more photodiodes. The photodiodes generate an electrical current in response to an optical signal received in the circuit portion. The POR circuit provides a reset signal to the circuit portion of the integrated circuit including the photodiodes. The reset signal keeps the circuit portion in a reset state when the power supply voltage is below a threshold and releases the reset of the circuit portion when the power supply voltage is above the threshold thereby enabling the circuit portion. The optoelectronic integrated circuit is often illuminated from the backside of the integrated circuit so that stray light impinging on the POR circuit may generate a parasitic unwanted current by the substrate diodes between the collector regions of the bipolar transistors and the semiconductor substrate which parasitically form a photodiode for the stray light. The power on reset circuit according to the principles of the present disclosure includes the compensation transistors so that the unsymmetric photoelectronic effect caused by the parasitic photodiodes of the bipolar transistors of the bandgap current switch is compensated by the first and second compensation transistors maintaining a stable tripping point.

One or more of the above-mentioned objects are also achieved by an integrated circuit comprising the features of present claim 15.

According to an embodiment, the integrated circuit comprises a circuit portion which includes at least one pad area such as a metal pad disposed on a surface of the integrated circuit. The POR circuit releases the reset of the circuit portion of the integrated circuit including the pad area and thereby enables the circuit portion. The pad area may be used to receive a bonding wire to receive or transmit an external electrical signal. Such pad areas may be equipped with electrostatic discharge structures so that external interferences such as electromagnetic interferences (EMI) are prevented from entering into the electronic circuit. ESD structures are often used in integrated circuits for industry or automotive applications, where EMI events may take place. The ESD structure may include a doping region disposed in the semiconductor substrate of the integrated circuit wherein the doping region is connected to the pad area. The POR circuit according to the principles of the present disclosure may generate lateral substrate currents between the collectors of the bipolar transistors and the doping region of the ESD structure. The first and second compensation transistors generate additional parasitic currents at the output terminal that compensate the parasitic currents generated by the bipolar transistors of the bandgap current switch so that a stable tripping point of the POR circuit is maintained even in the case of an ESD operation in response to an EMI impulse.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

DETAILED DESCRIPTION OF THE EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 2:
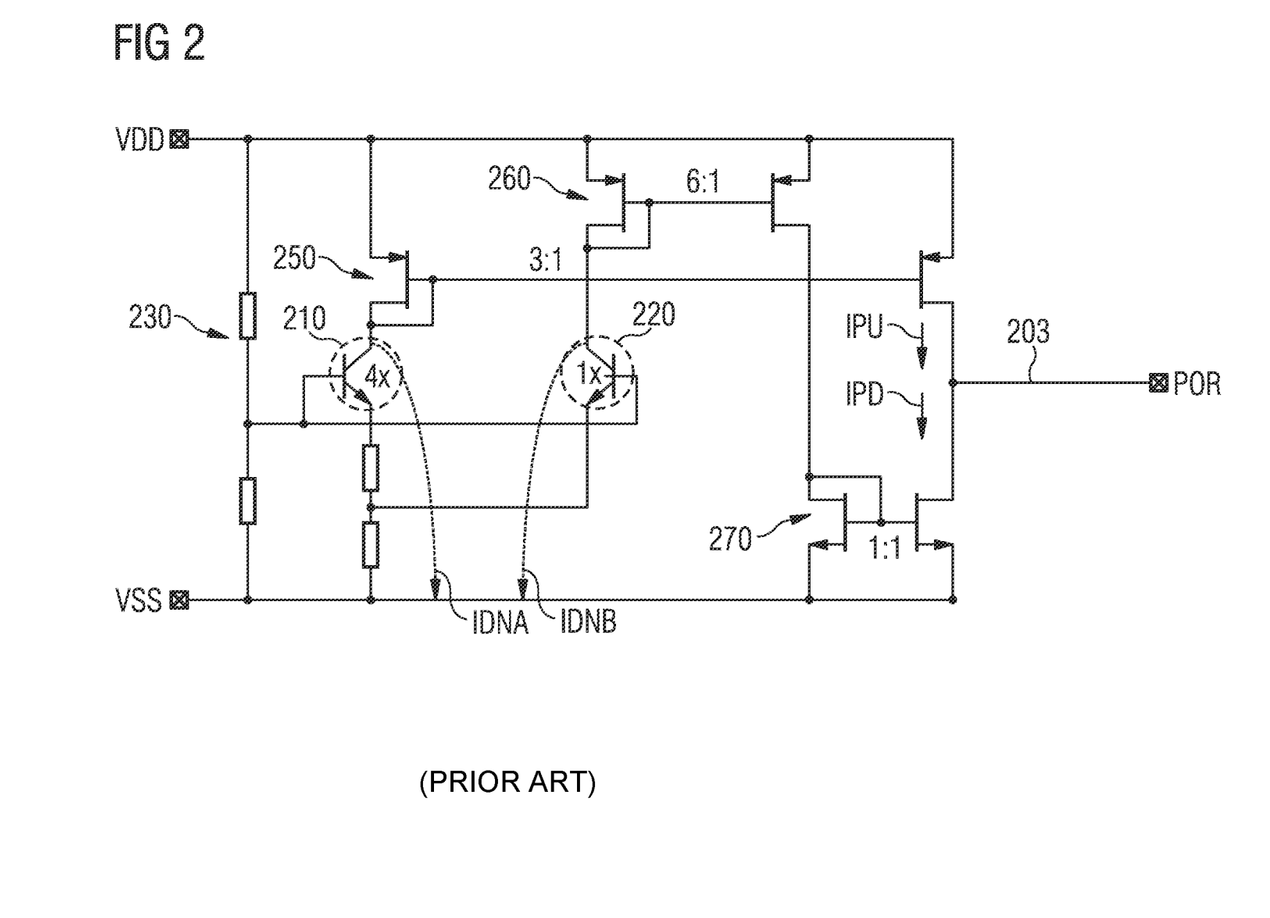
FIG. 2 shows a conventional POR circuit.

FIG. 2 shows a conventional power on reset (POR) circuit. The conventional circuit includes a bandgap current switch comprising two bipolar transistors 210, 220 which are controlled by a voltage divider 230 supplied with the supply voltage VDD, VSS. When the supply voltage VDD, VSS is below a threshold, current flows through transistor 210 and is mirrored through current mirror 250 to pull up current IPU pulling output terminal 230 to supply potential VDD. The output signal POR is high (POR=1), indicating a power on reset condition. When the supply voltage VDD, VSS is beyond the threshold, the current switches from transistor 210 to transistor 220. The collector current of transistor 220 is mirrored through current mirrors 260, 270 to pull down current IPD at output terminal 203, pulling the output signal POR to a low level (POR=0) so that the output signal POR changes from a reset-condition to an on-condition indicating normal operation so that the functional circuits can be supplied with the supply voltage.

If an energy impact occurs at the POR circuit, such as high temperature, electromagnetic interference or stray light, so that a substrate current is generated in the chip, the collector regions of transistors 210, 220 draw a parasitic current from the collectors into the substrate of the integrated circuit to ground potential VSS such as currents IDNA, IDNB. In one conventional embodiment, it may be assumed that the collector area of transistor 210 is four times the collector area of transistor 220 and current mirror 250 has a current transformation ratio of 3:1, current mirror 260 of 6:1 and current mirror 270 of 1:1. The parasitic current IDNB of transistor 220 is mirrored into the output node 203 with a ratio of 1/6, whereas the parasitic current IDNA of transistor 210 is mirrored into the output node 203 with a ratio of 4/3. The tripping point of the output node occurs when the currents IPU and IPD are equal so that in case of an energy impact generating parasitic substrate currents, there is an increased tendency to flip to a power on reset situation, pulling output terminal 203 to a high level. If the POR circuit indicates normal, non-reset operating condition having the output signal POR=0, a parasitic current from an external interference may cause a switching of the circuit generating a reset condition POR=1 so that the operative circuit controlled by the power on reset circuit is reset and its operation is unintentionally interrupted and all the operative data may be lost. The external interferences that may lead to such a POR failure may happen, for example, in an industrial or automotive environment or in a photoelectric application.

Figure 1:
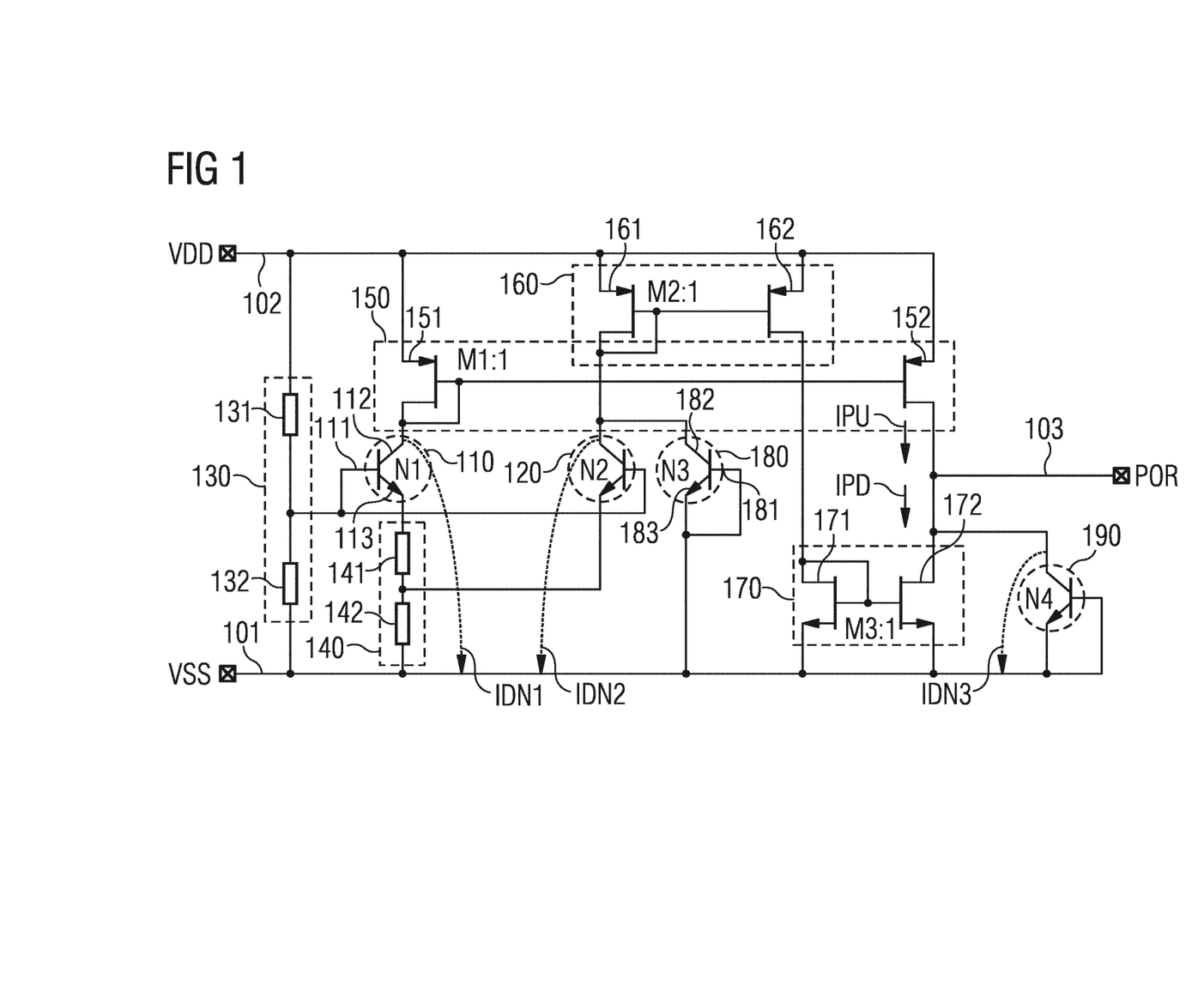
FIG. 1 shows a schematic diagram of a power on reset circuit according to the principles of the present disclosure.

FIG. 1 shows a POR circuit according to the principles of the present disclosure. The POR circuit is robust against external influences that generate parasitic substrate currents in that it compensates the effect of parasitic substrate currents. The POR circuit of FIG. 1 includes a bandgap circuit comprising bipolar transistors 110, 120 having base terminals connected to each other and connected to an output node of a resistive, ohmic voltage divider 130. Voltage divider 130 includes ohmic resistors 131, 132 connected between terminals 101, 102 for reference potential VSS and supply potential VDD, respectively. The emitters of transistors 110, 120 are resistively coupled to terminal 101 for reference potential VSS. A voltage divider 140 is connected between the emitters of transistors 110, 120 and reference potential terminal 101. Voltage divider 140 includes ohmic resistors 141, 142 connected between the emitter of transistor 110 and reference potential terminal 101. An intermediate or middle node which is the output node of voltage divider 140 is connected to the emitter of transistor 120. Transistor 110 has a larger collector area than transistor 120. Transistor 110 has a collector area of N1 units and transistor 120 has a collector of N2 units. The arrangement of voltage dividers and transistors as explained establishes a bandgap circuit having a tripping point at the bandgap voltage of silicon such as 1.2 V. When the base potential of transistors 110, 120 is below the bandgap voltage, current flows through transistor 110. When the base potential is above the bandgap voltage, current flows through transistor 120 so that transistors 110, 120 establish a bandgap current switch. The resistors 131, 132 of voltage divider 130 can be designed such that the tripping point of the bandgap current switch occurs at a desired level of the supply voltage VDD, VSS.

The collector current of transistor 110 is mirrored into an output terminal 103 through a current mirror 150 providing pull-up current IPU at output terminal 103. The collector current of transistor 120 is mirrored into the output terminal 103 through a high side current mirror 106 and a low side current mirror 170 providing pull-down current IPD at output terminal 103. Current mirror 150 comprises an input path including a diode-connected transistor 151 connected between the collector of transistor 110 and supply potential terminal 102. Current mirror 150 further comprises an output path including a transistor 152 connected between output terminal 103 and supply potential terminal 102. The control terminals of transistors 151, 152 are connected to each other. The control terminal of transistor 151 is connected to its drain terminal to form a diode. A current through transistor 151 controls a corresponding current through transistor 152. Depending on the dimensions of transistors 151, 152, the currents through these transistors have a ratio of M1:1. The current transformation ratio is set by the relation of the sizes of the transistors 151, 152 represented by the relation of width to length (W/L) of the gate areas of the transistors 151, 152.

While transistors 151, 152 are P-channel MOSFETs, the transistors 110, 120 of the bandgap portion are bipolar NPN-transistors. The bipolar transistors provide a defined switching point which can be manufactured reproducably. The W/L ratio of the field effect transistors can be manufactured in a well controlled manner to obtain a desired current through the field effect transistors. The circuit of FIG. 1 is realized on an integrated chip mainly dedicated to CMOS devices of two polarities such as P-channel and N-channel MOSFETs, further allowing the forming of at least one version of bipolar transistors such as NPN-transistors.

Current mirror 160 comprises an input path including diode-connected transistor 161 connected between the collector of transistor 120 and supply potential terminal 102 and an output path including transistor 162 connected to supply potential terminal 102. Transistors 161, 162 are P-channel MOSFETs of which the gate terminals are connected with each other. The current through transistor 162 is further mirrored by current mirror 170 to output terminal 103. Current mirror 170 includes an input path including diode-connected transistor 171 connected between the drain of transistor 162 and reference potential terminal 101. An output path of current mirror 170 includes transistor 172 connected between output terminal 103 and reference potential terminal 101. The gate terminals of the N-channel MOSFETs 171, 172 are connected with each other. The current transformation ratio of current mirror 160 is M2:1, the current transformation ratio of current mirror 170 is M3:1.

In an embodiment, the collector area of transistors 110, 120 and the current transformation ratios of current mirrors 150, 160, 170 may be as follows. Transistor 110 has a collector area of N1 units which may be 4 (four) units. Transistor 210 has a collector area of N2 units which may be 1 (one) unit. Current mirror 150 may have a current ratio of 3:1, current mirror 160 a ratio of 6:1, current mirror 170 a ratio of 1:1. Other ratios generating a similar or identical effect may also be possible. In an embodiment, the transistor 110 is generated by an integer multiple of bipolar units, wherein the units are connected parallel to each other to achieve the desired collector area. A parallel collection of bipolar units allows a defined and well-controlled fabrication of a desired collector size.

The function of the circuit in FIG. 1 in normal operation mode is the same as the function described in connection with the conventional circuit of FIG. 2 as the transistors 180, 190 do not carry a recognizable current in normal operating mode. In the case of an external interference causing a substrate current such as high temperature, electromagnetic interference, stray light or others, a predominantly vertical or predominantly lateral substrate current may be generated, as explained in connection with FIG. 3.

Figure 3:
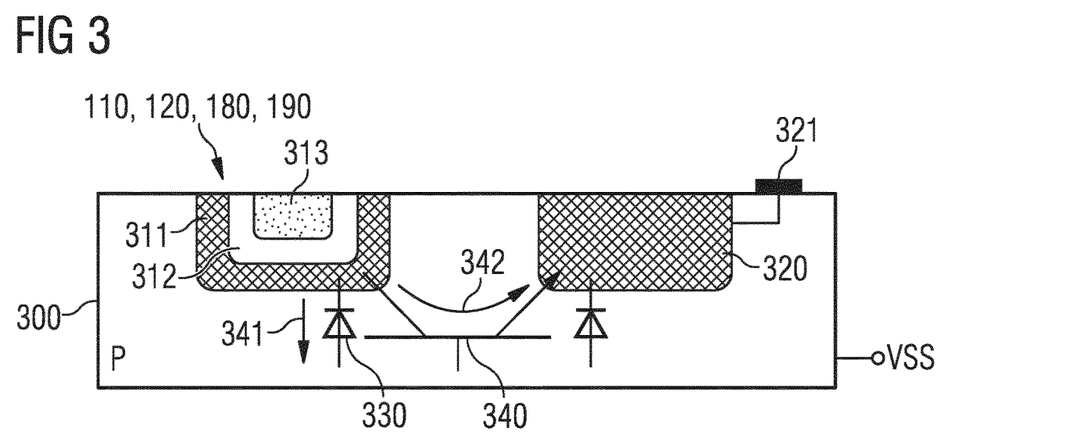
FIG. 3 shows a cross-section through a portion of a semiconductor substrate of the power on reset circuit of FIG. 1 and through an external terminal.

FIG. 3 shows a cross-section through one of the bipolar transistors such as transistors 110, 120. The doping regions of one of the transistors are arranged in a semiconductor substrate 300 of P-conductivity type. A deep doping well 311 forms the collector of the bipolar transistor of N-conductivity type. The collector well includes a doping region 312 of P-conductivity type forming the base of the bipolar transistor. A doping region 313 of N-conductivity type within the P-doping region 312 constitutes the emitter of the bipolar transistor. A parasitic substrate diode 330 is formed by the deep N-well doping region 311 of the collector and the P-substrate 300. In the case of high temperature, a leakage current 341 through the parasitic substrate diode 330 is increased and may no longer be negligible concerning the contributions of the mirrored versions of said leakage current at the output terminal 103. Also an optical stray light coupling into the semiconductor chip, for example, through the backside of the chip may generate a photocurrent such as 341 by the parasitic substrate diode acting as a parasitic photodiode. Stray light may impinge on the backside of the chip portion carrying the POR circuit when the chip is an optoelectronic chip illuminated form the backside.

Furthermore, the semiconductor substrate 300 may include an N-well such as 320 which may be a deep N-well for other electrical reasons. N-well 320 may be a portion of an ESD protection structure which may be coupled to a metal pad 321 that forms a connection area to receive or transmit electrical signals through a bond wire connected to pad area 321. A parasitic transistor 340 is established by deep N-well doping area 311 of the bipolar transistor, P-substrate 300 and N-well 320 of the ESD protection structure. The substrate 300 is usually biased by ground potential VSS and connected ground potential terminal 101. An electromagnetic interference (EMI) impulse may bias deep N-well doping region 320 negatively even to a potential below reference potential VSS so that parasitic transistor 340 may become conductive and generate a lateral parasitic current 342. As already explained in connection with FIG. 2, the vertical and lateral substrate currents generate a current in the collectors of transistors 110, 120 which is mirrored into the output node through current mirrors 150, 160 and 170 in an unsymmetric way so that there is a risk that the output signal POR is reset to a high level by the external interference, causing a POR failure.

In order to avoid such a failure and make the POR circuit robust against substrate currents and against the above-mentioned external impacts, compensation transistors 180, 190 are provided. Compensation transistor 180 is connected to the collector of transistor 120 and to ground potential terminal 101. In the shown embodiment, compensation transistor 180 is connected to that one of the transistors 110, 120 which has the smaller collector area which is transistor 120 having a collector area of one unit compared to transistor 110 having a collector area of more than one, such as four, units. Situations may exist in which compensation transistor 180 is connected to the other transistor having the larger collector area, such as transistor 110. Compensation transistor 190 is connected between output terminal 103 and reference potential terminal 101. At the same time, compensation transistor 190 is connected in parallel to the output path of the third current mirror 170, such as transistor 172. Compensation transistors 180, 190 are determined such that the overall contribution of the parasitic pull up and pull down currents at the output terminal 103 are substantially the same so that they equalize each other and avoid a tendency of the POR output signal towards the supply voltage or the reference voltage. Compensation transistors 180, 190 are designed such that they compensate the unsymmetry explained above generated by the substrate currents of the bipolar transistors of the bandgap circuit with regard to the output signal POR at terminal 103. The arrangement of doping regions shown in FIG. 3 corresponds also to the compensation transistors 180, 190.

In an embodiment, compensation transistors 180, 190 may comprise substrate diodes comprising an N-well doping area and the semiconductor substrate. In this regard, transistors 180, 190 may be realized as bipolar transistors of which the bases are connected to the emitter. In the embodiment shown in FIG. 1, transistors 180 is realized as a bipolar transistor of which the base terminal 181 is connected to the emitter terminal 183, wherein both are connected to ground potential terminal 101. In the same way, transistors 190 is realized as a bipolar transistor of which base and emitter terminals are connected to each other and to ground potential terminal 101. Moreover, the collector areas of the compensation transistors 180, 190 are such that the contributions to the pull-up and the pull-down currents at the output node 103 in the case of an external interference are substantially equalized. In the case of the given collector areas of transistors 110, 120 and the current transformation ratios of current mirrors 150, 160, 170 as explained above, it is useful to set the collector area of the compensation transistor 180 as N3 being one (1) unit and the collector area of the compensation transistor 190 as N4 being one (1) unit. The compensation transistors 180, 190 are bipolar transistor units so that they are matched to the transistor units forming transistors 110, 120. The described transistors 180, 190 are realized as substrate diodes using bipolar transistors with shorted base terminals so that they do not contribute to the current consumption of the device during normal operation since they are in an off-state during normal operating mode. They only carry a substrate current during an external interference so that their current consumption is negligible.

In the case of an external interference, the collector of transistor 110 generates a parasitic substrate current IDN1. The joint collectors of transistors 120, 180 generate another substrate current IDN2. Transistor 190 generates another substrate current IDN3. The contribution of parasitic substrate current IDN1 to the pull-up current IPU at output terminal 103 is 4/3 current units considering a collector area of 4 units for transistor 110 and a current mirror ratio 3:1 for current mirror 150. The contribution of parasitic currents IDN2, IDN3 to the pull-down current at output terminal 103 is (1+1)/(6×1)+1=4/3 considering the collector areas of transistors 120, 180 each being one unit and the mirror ratio of 6:1 for current mirror 160 and 1:1 for current mirror 170 and one collector unit for transistor 190. Accordingly, the pull-up and pull-down current contributions at output terminal 103 for the parasitic substrate currents in the circuit of FIG. 1 are in each case 4/3 and thereby equalized.

More general, for arbitrary collector areas of the bipolar transistors and for arbitrary current ratios of the current mirrors, wherein transistors 110, 120, 180, 190 having a collector area of N1, N2, N3 and N4, respectively, and current mirrors 150, 160, 170 having a current transformation ratio of M1:1, M2:1 and M3:1, respectively, the area and ratio values should comply with the following formula to ensure that the pull-up and pull-down current contributions of substrate currents at the output terminal 103 are equalized:

$$N1/M1=(N2+N3)/(M2\times M3)+N4$$

The POR circuit of FIG. 1 according to the principles of the present disclosure may be useful in connection with an integrated circuit directed to industrial, automotive or photoelectronic applications as explained in connection with FIG. 4.

Figure 4:
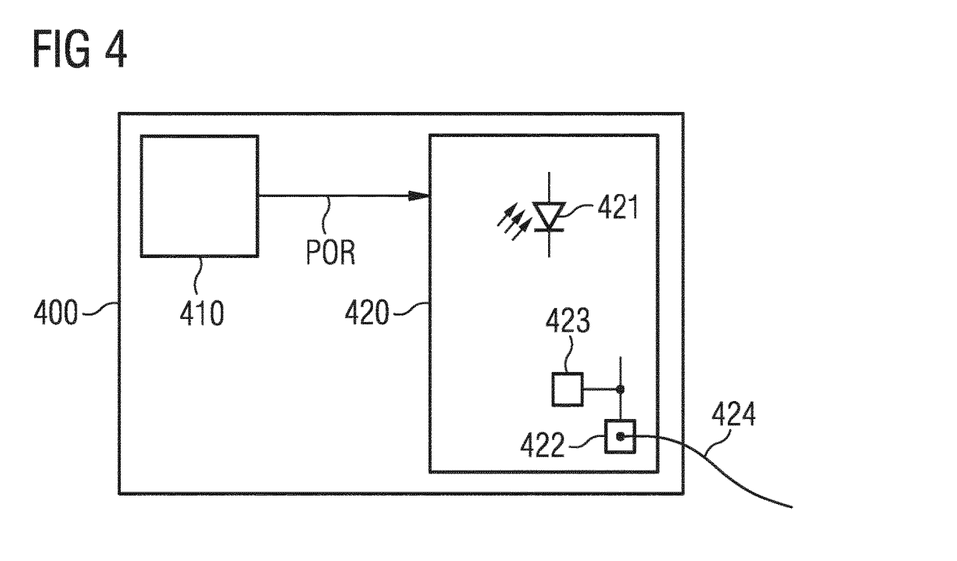
FIG. 4 shows an integrated circuit including the power on reset circuit of FIG. 1 and a functional circuit portion including photodiode and external terminal.

FIG. 4 shows an integrated circuit 400 which includes the POR circuit 410 of FIG. 1 generating a POR signal to control a power on reset of the circuit portion 420 monolithically integrated on the same chip 400. Circuit portion 420 includes a photodiode 421 and a pad area 422 to which an electrostatic discharge (ESD) structure 423 is connected. Circuit portion 420 may include only one of these elements such as photodiode 421 or pad/ESD structure 422, 423 or both of them as depicted in FIG. 4.

Photodiode 421 generates a current in response to the impinging of optical visible and/or invisible light including infrared or UV light. Photodiodes are often realized for backside illumination so that light impinging through the backside of the chip generates a photocurrent. Stray light may also impinge on the backside of the POR circuit portion 410 generating a parasitic photocurrent through the parasitic substrate diodes that may act parasitically as photodiodes. The POR circuit 410 of FIG. 1 is robust against said stray light generated substrate currents in that the contribution of the substrate currents to the switching point is symmetric and compensated so that they do not alter the tripping point of the signal POR at output terminal 103.

The use of the chip 400 in an industrial or automotive environment may require that the chip operates under high temperature conditions or is subject to electromagnetic interference (EMI) events. A high temperature may generate increased leakage currents through the parasitic substrate diodes. An EMI event may affect an ESD structure 423 which may be connected to a pad area 422. Pad area 422 is a metal area on the top side of the chip which is accessible from the outside so that a bond wire 424 can be bonded to the pad area 422. Pad area 422 and/or the bond wire may have the function of a parasitic antenna in the case of an EMI impulse so that ESD structure 423 drains the parasitic EMI signal to ground. ESD structure 423 may include a doping area, such as 320 shown in FIG. 3, designed to drain the relatively large EMI energy. In this case, a parasitic lateral transistor, such as 340 shown in FIG. 3, may generate a lateral substrate current 342. The POR circuit 410 of FIG. 1 compensates and equalizes the parasitic substrate currents in the POR circuit without altering the tripping point of the POR output signal, making it robust against high temperature and EMI situations.

It will be apparent to those skilled in the art that various modifications and variations can be made without departing from the spirit or scope of the disclosure as laid down in the appended claims. Since modifications, combinations, subcombinations and variations of the disclosed embodiments incorporating the spirit and substance of the disclosure may occur to the persons skilled in the art, the disclosure should be construed to include everything within the scope of the appended claims.

The invention claimed is:

1. A power on reset circuit, comprising:
   a terminal for a reference potential and a terminal for a supply potential;
   a voltage divider coupled between the terminal for a reference potential and the terminal for a supply potential;
   a first transistor and a second transistor each having a base connected to the voltage divider, a collector and an emitter resistively coupled to the terminal for a reference potential;
   a first current mirror coupled to the first transistor and to an output terminal, the output terminal configured to provide an output signal in response to a voltage between the terminals for a reference and a supply potential;
   a second current mirror coupled to the second transistor and coupled to the output terminal through a third current mirror;
   a first compensation transistor coupled between the collector of one of the first and second transistors and the terminal for a reference potential; and
   a second compensation transistor coupled between the output terminal and the terminal for a reference potential.

2. The power on reset circuit according to claim 1, wherein the first compensation transistor and the second compensation transistor each comprise a bipolar transistor having a base, a collector and an emitter, wherein the base is connected to the emitter.

3. The power on reset circuit according to claim 2, wherein the collectors of the first transistor and the second transistor each have a collector area, wherein the collector area of the first transistor is a multiple of the collector area of the second transistor.

4. The power on reset circuit according to claim 3, wherein the first compensation transistor is connected to the collector of the second transistor and the base and the emitter of the first compensation transistor are connected to the terminal for a reference potential.

5. The power on reset circuit according to claim 1, wherein the first current mirror comprises an input path including a diode-connected transistor connected to the collector of the first transistor and the terminal for a supply potential and comprises an output path including a transistor having a control terminal connected to the control terminal of the transistor of the input path, the transistor of the output path connected between the output terminal and the terminal for a supply potential.

6. The power on reset circuit according to claim 1, wherein the second current mirror comprises an input path including a diode-connected transistor connected to the collector of the second transistor and the terminal for a supply potential and comprises an output path including a transistor having a control terminal connected to the control terminal of the transistor of the input path of the second current mirror, wherein the third current mirror comprises an input path including a diode-connected transistor connected to the transistor of the output path of the second current mirror and an output path including a transistor having a control terminal connected to the control terminal of the transistor of the input path of the third current mirror, the transistor of the output path of the third current mirror connected between the output terminal and the terminal for a reference potential.

7. The power on reset circuit according to claim 6, wherein the base-collector path of the second compensation transistor is connected in parallel to the transistor of the output path of the third current mirror.

8. The power on reset circuit according to claim 6, wherein the first transistor has a collector area of N1 units, the second transistor has a collector area of N2 units, the first compensation transistor has a collector area of N3 units and the second compensation transistor has a collector area of N4 units, the first current mirror has a current transformation ratio of M1:1, the second current mirror has a current transformation ratio of M2:1 and the third current mirror has a current transformation ratio of M3:1, wherein the collector areas and current transformation ratios are related according to the following formula:

$$N1/M1=(N2+N3)/(M2\times M3)+N4.$$

9. The power on reset circuit according to claim 1, wherein the ratio of collector areas between the first transistor and the second transistor is 4:1, the current transformation ratio of the first current mirror is 3:1 and the current transformation ratio of the second current mirror is 6:1, wherein the ratio of collector areas between the second transistor and the first compensation transistor is 1:1 and the ratio of collector areas between the second transistor and the second compensation transistor is 1:1.

10. The power on reset circuit according to claim 1, wherein the first and second transistors are bipolar transistors and the transistors of the current mirrors are field-effect transistors.

11. The power on reset circuit according to claim 1, further comprising a voltage divider comprising a resistor connected to the emitter of the first transistor and another resistor connected to the terminal for a reference potential, wherein the emitter of the second transistor is connected to a node disposed between the resistors of the voltage divider.

12. The power on reset circuit according to claim 1, further comprising:
   a semiconductor substrate of a first conductivity type which includes a deep well of a second conductivity type different from the first conductivity type, the deep well forming the collector of at least one of the first and second transistors; and
   a doping region of the second conductivity type disposed in the semiconductor substrate.

13. The power on reset circuit according to claim 12, wherein the power on reset circuit is disposed in an integrated circuit and the doping region is connected to a terminal of the integrated circuit configured to receive or transmit an external signal.

14. An optoelectronic integrated circuit, comprising:
   a circuit portion including at least one photodiode, the circuit portion configured to operate in response to an optical signal received by the at least one photodiode; and
   the power on reset circuit according to claim 1, wherein the circuit portion is configured to be enabled by the output signal of the power on reset circuit in response to the voltage between the terminals for a reference and a supply potential.

15. An integrated circuit, comprising:
   a circuit portion including at least one pad area configured to at least one of receive and transmit an external electrical signal and an electrostatic discharge structure connected to the pad area, the electrostatic discharge structure including a doping region disposed in the substrate of the integrated circuit and connected to the pad area, the power on reset circuit according to claim 1, wherein the circuit portion is configured to be enabled by the output signal of the power on reset circuit in response to the voltage between the terminals for a reference and a supply potential.

* * * * *